United States Patent
Lee et al.

(10) Patent No.: US 11,194,712 B2
(45) Date of Patent: Dec. 7, 2021

(54) MEMORY CONTROLLER AND OPERATING METHOD FOR PERFORMING GARBAGE COLLECTION OPERATION IN MEMORY DEVICES

(71) Applicant: SK hynix Inc., Icheon-si (KR)

(72) Inventors: Mi Hee Lee, Seongnam-si (KR); Dae Gyu Ha, Yongin-si (KR); Ho Ryong You, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/596,606

(22) Filed: Oct. 8, 2019

(65) Prior Publication Data
US 2020/0310966 A1  Oct. 1, 2020

(30) Foreign Application Priority Data
Mar. 27, 2019  (KR) .......................... 10-2019-0035041

(51) Int. Cl.
*G06F 12/02* (2006.01)
(52) U.S. Cl.
CPC .. *G06F 12/0253* (2013.01); *G06F 2212/1044* (2013.01)
(58) Field of Classification Search
CPC ............. G06F 12/0253; G06F 12/0261; G06F 12/0269; G06F 12/0276; G06F 2212/1044; G06F 12/0246
See application file for complete search history.

(56) References Cited

U.S. PATENT DOCUMENTS

| | | | |
|---|---|---|---|
| 9,910,622 B2 | 3/2018 | Law | |
| 2009/0198952 A1* | 8/2009 | Khmelnitsky | G06F 12/0246 711/206 |
| 2010/0082890 A1* | 4/2010 | Heo | G06F 9/4406 711/103 |
| 2013/0326119 A1* | 12/2013 | Lee | G06F 12/0246 711/103 |

(Continued)

FOREIGN PATENT DOCUMENTS

KR  10-2018-0009430  1/2018

OTHER PUBLICATIONS

The American Heritage Dictionary of the English Language, 2020, Fifth Edition, Houghton Mifflin Harcourt Publishing Company, https://www.ahdictionary.com/word/search.html?q=free (Year: 2020).*

*Primary Examiner* — Michael Krofcheck
(74) *Attorney, Agent, or Firm* — Perkins Coie LLP

(57) ABSTRACT

A memory controller for controlling a memory device including memory blocks is provided. The memory controller includes: a garbage collection state determiner in communication with a host device and configured to receive a garbage collection state request from the host device and determine whether the memory device is in a state that garbage collection is necessary and a block information storage unit in communication with the garbage collection state determiner and configured to receive, from the memory device, bad block generation information including a number of bad blocks included in the memory device that are unable to store data, and store block information including a total number of the memory blocks, the number of bad blocks, and a number of free blocks included in the memory device that are assigned for garbage collection.

20 Claims, 16 Drawing Sheets

(56) References Cited

U.S. PATENT DOCUMENTS

| | | | |
|---|---|---|---|
| 2014/0359382 A1* | 12/2014 | Choi | G11C 29/82 |
| | | | 714/710 |
| 2016/0299722 A1* | 10/2016 | Seo | G06F 3/0665 |
| 2017/0123726 A1* | 5/2017 | Sinclair | G06F 3/0679 |
| 2018/0276123 A1* | 9/2018 | Matsudaira | G06F 12/0276 |
| 2019/0042106 A1* | 2/2019 | Klein | G06F 3/0616 |
| 2019/0354476 A1* | 11/2019 | Park | G06F 3/0679 |
| 2020/0026457 A1* | 1/2020 | Silbermintz | G06F 3/0679 |
| 2020/0218654 A1 | 7/2020 | Lee | |

* cited by examiner

FIG. 7A

| BLK0 | BLK1 | BLK2 | BLK3 | BLK4 | BLK5 | BLK6 | BLK7 |
|------|------|------|------|------|------|------|------|
| BLK8 | BLK9 | BLK10 | BLK11 | BLK12 | BLK13 | BLK14 | BLK15 |
| BLK16 | BLK17 | BLK18 | BLK19 | BLK20 | BLK21 | BLK22 | BLK23 |
| BLK24 | BLK25 | BLK26 | BLK27 | BLK28 | BLK29 | BLK30 | BLK31 |
| BLK32 | BLK33 | BLK34 | BLK35 | BLK36 | BLK37 | BLK38 | BLK39 |
| BLK40 | BLK41 | BLK42 | BLK43 | BLK44 | BLK45 | BLK46 | BLK47 |

Reserved Block (BLK0–BLK15)
Open Block (BLK16–BLK47)

FIG. 7B

| Total Block# | 48 |
|---|---|
| Reserved Block# | 16 |
| Free Block# | 8 |
| Open Block# | 32 |

FIG. 8A

| BLK0 | BLK1 | BLK2 | BLK3 | BLK4 | BLK5 | BLK6 | BLK7 |
|------|------|------|------|------|------|------|------|
| BLK8 | BLK9 | BLK10 | BLK11 | BLK12 | BLK13 | BLK14 | BLK15 |
| BLK16 | BLK17 | BLK18 | BLK19 | BLK20 | BLK21 | BLK22 | BLK23 |
| BLK24 | BLK25 | BLK26 | BLK27 | BLK28 | BLK29 | BLK30 | BLK31 |
| BLK32 | BLK33 | BLK34 | BLK35 | BLK36 | BLK37 | BLK38 | BLK39 |
| BLK40 | BLK41 | BLK42 | BLK43 | BLK44 | BLK45 | BLK46 | BLK47 |

- Rows BLK0–BLK15: Reserved Block
- Rows BLK16–BLK31: Open Block
- Rows BLK32–BLK47: Bad Block

FIG. 8B

| Total Block# | 48 |
|---|---|
| Reserved Block# | 16 |
| Free Block# | 8 |
| Open Block# | 16 |
| RTBB# | 14 |
| MBB# | 2 |

FIG. 9

| BLK0 | BLK1 | BLK2 | BLK3 | BLK4 | BLK5 | BLK6 | BLK7 |
| 0 | 0 | 0 | 0 | 0 | 0 | 0 | 0 |
| BLK8 | BLK9 | BLK10 | BLK11 | BLK12 | BLK13 | BLK14 | BLK15 |
| 0 | 0 | 0 | 0 | 0 | 0 | 0 | 0 |
| BLK16 | BLK17 | BLK18 | BLK19 | BLK20 | BLK21 | BLK22 | BLK23 |
| 0 | 0 | 0 | 0 | 0 | 0 | 0 | 0 |
| BLK24 | BLK25 | BLK26 | BLK27 | BLK28 | BLK29 | BLK30 | BLK31 |
| 0 | 0 | 0 | 0 | 0 | 0 | 0 | 0 |
| BLK32 | BLK33 | BLK34 | BLK35 | BLK36 | BLK37 | BLK38 | BLK39 |
| 1 | 1 | 1 | 1 | 1 | 1 | 1 | 1 |
| BLK40 | BLK41 | BLK42 | BLK43 | BLK44 | BLK45 | BLK46 | BLK47 |
| 1 | 1 | 1 | 1 | 1 | 1 | 1 | 1 |

FIG. 10A

| BLK0 | BLK1 | BLK2 | BLK3 | BLK4 | BLK5 | BLK6 | BLK7 |
|------|------|------|------|------|------|------|------|
| BLK8 | BLK9 | BLK10 | BLK11 | BLK12 | BLK13 | BLK14 | BLK15 |
| BLK16 | BLK17 | BLK18 | BLK19 | BLK20 | BLK21 | BLK22 | BLK23 |
| BLK24 | BLK25 | BLK26 | BLK27 | BLK28 | BLK29 | BLK30 | BLK31 |
| BLK32 | BLK33 | BLK34 | BLK35 | BLK36 | BLK37 | BLK38 | BLK39 |
| BLK40 | BLK41 | BLK42 | BLK43 | BLK44 | BLK45 | BLK46 | BLK47 |

Reserved Block (BLK0–BLK15)
Bad Block (BLK16–BLK47)

FIG. 10B

| Total Block# | 48 |
|---|---|
| Reserved Block# | 8 |
| Free Block# | 8 |
| Open Block# | 0 |
| RTBB# | 38 |
| MBB# | 2 |

MEMORY CONTROLLER AND OPERATING METHOD FOR PERFORMING GARBAGE COLLECTION OPERATION IN MEMORY DEVICES

CROSS-REFERENCE TO RELATED APPLICATION

This patent document claims priority to the Korean patent application number 10-2019-0035041 filed on Mar. 27, 2019, which is incorporated herein by reference in its entirety for all purposes.

TECHNICAL FIELD

Exemplary embodiments generally relate to an electronic device, and more particularly, to a memory controller and an operating method thereof.

BACKGROUND

A storage device is a device configured to store data under the control of a host device such as a computer, a smart phone or a smart pad. The storage device includes a device configured to store data on a magnetic disk, such as a Hard Disk Drive (HDD), and a device configured to store data on a semiconductor memory, i.e., a nonvolatile memory, such as a Solid State Drive (SSD) or a memory card.

The storage device may include a memory device configured to store data and a memory controller configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Embodiments provide a memory controller configured to perform a "garbage collection" operation based on the status of a memory device and an operating method of the memory controller.

In one aspect, there is provided a memory controller for controlling a memory device including memory blocks, the memory controller including: a garbage collection state determiner in communication with a host device and configured to receive a garbage collection state request from the host device and determine whether the memory device is in a state that garbage collection is necessary and a block information storage unit in communication with the garbage collection state determiner and configured to receive, from the memory device, bad block generation information including a number of bad blocks included in the memory device that are unable to store data, and store block information including a total number of the memory blocks, the number of bad blocks, and a number of free blocks included in the memory device that are assigned for garbage collection, and wherein the garbage collection state determiner determines whether the memory device is in the state that the garbage collection is necessary based on the number of bad blocks and the number of free blocks.

In accordance aspect, there is provided a method for operating a memory controller in communication with a memory device including memory blocks, the method including: sending a request to the memory device for bad block generation information that includes a number of bad blocks, the bad blocks representing those memory blocks in the memory device that are unable to store data, receiving the bad block generation information from the memory device, storing, based on the bad block generation information, block information including a total number of the memory blocks, the number of bad blocks, a number of free blocks, the free blocks representing those memory blocks in the memory device that are usable for garbage collection and determining, based on the block information, whether the memory device is in a state in which garbage collection is necessary and wherein the determining further includes determining whether the number of free blocks is equal to or greater than a difference between the total number of the memory blocks and the number of bad blocks.

BRIEF DESCRIPTION OF THE DRAWINGS

Example embodiments will now be described hereinafter with reference to the accompanying drawings; however, disclosed technology may be embodied in different forms and should not be construed as limited to the embodiments set forth herein.

FIG. 7A shows an example of a diagram illustrating memory blocks included in a memory device based on one implementation of the disclosed technology.

FIG. 7B shows an example of a diagram illustrating block information stored in a block information storage unit based on one implementation of the disclosed technology.

FIG. 8A shows an example of a diagram illustrating memory blocks included in a memory device based on one implementation of the disclosed technology.

FIG. 8B shows an example of a diagram illustrating block information stored in a block information storage unit based on one implementation of the disclosed technology.

FIG. 9 is an example of a diagram illustrating a bad block table stored in a block information storage unit.

FIG. 10A shows an example of a diagram illustrating memory blocks included in a memory device based on one implementation of the disclosed technology.

FIG. 10B shows an example of a diagram illustrating block information stored in a block information storage unit based on one implementation of the disclosed technology.

DETAILED DESCRIPTION

Figure 1:
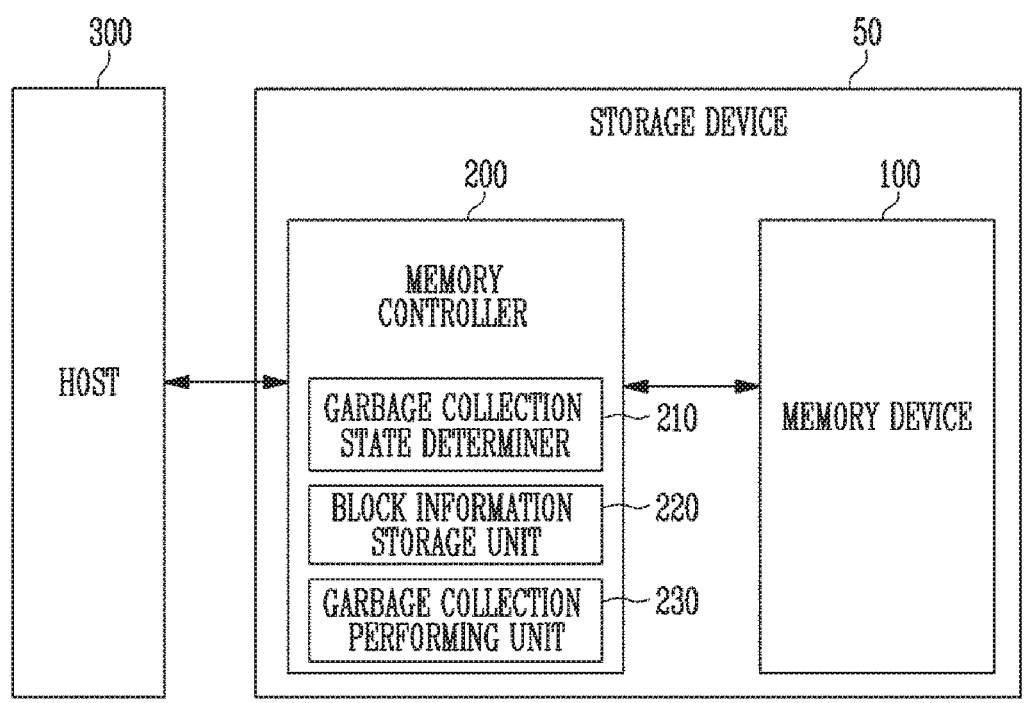
FIG. 1 is an example of a block diagram illustrating a storage device based on one implementation of the disclosed technology.

The specific structural or functional description disclosed herein is merely illustrative for the purpose of describing embodiments according to the concept of the disclosed technology. The embodiments according to the concept of the disclosed technology can be implemented in various forms, and cannot be construed as limited to the embodiments set forth herein.

The embodiments according to the disclosed technology can be modified in various ways. Thus, the embodiments are illustrated in the drawings and are intended to be described herein in detail. However, the embodiments according to the concept of the disclosed technology are not construed as limited to specified disclosures, and include all changes, equivalents, or substitutes that do not depart from the spirit and technical scope of the disclosed technology.

Hereinafter, exemplary embodiments of the disclosed technology will be described in detail with reference to the accompanying drawings.

FIG. 1 is an example of a block diagram illustrating a storage device.

Referring to FIG. 1, the storage device 50 may include a memory device 100 and a memory controller 200.

The storage device 50 may be a device for storing data under the control of a host 300, such as a mobile phone, a smart phone, an MP3 player, a laptop computer, a desktop computer, a game console, a TV, a tablet PC, or an in-vehicle infotainment.

The storage device 50 may be any one of various types of storage devices which store data under the control according to a host interface that is a communication scheme with the host 300. In some implementations, the host 300 can include a host device which includes a host interface. In some implementations, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, or others.

The storage device 50 may be or have any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), or a Wafer-level Stack Package (WSP).

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

The memory controller 200 may include a garbage collection state determiner 210. The term "garbage collection" as used herein may refer to a form of memory management, in which a garbage collector attempts to reclaim (garbage) memory that is occupied by objects that are no longer in use. The memory controller 200 may perform operations for garbage collection (GC) without any request from the host 300. In the disclosed technology, the garbage collection state determiner 210 may determine whether the memory device 100 is in a state in which the garbage collection is necessary, in response to a request from the host 300. The memory controller 200 may perform the garbage collection, based on the determination result by the garbage collection state determiner 210. In some implementations of the disclosed technology, the garbage collection state determiner 210 may determine whether the memory device 100 is in the state in which the garbage collection is necessary, based on block information BLK_INF received from a block information storage unit 220.

The garbage collection state determiner 210 may be in communication with the garbage collection state determiner 210 and output flag information FLAG_INF that responds to a request from the host 300. Thus, the garbage collection state determiner 210 may output, to the host 300, flag information FLAG_INF representing whether the memory device 100 is in a state in which the garbage collection is necessary. The flag information FLAG_INF may include a flag (FLAG) representing whether the memory device 100 is in the state in which the garbage collection is necessary. The host 300 may receive the flag information FLAG_INF, and determine whether the memory device 100 is in the state in which the garbage collection is necessary, based on the flag (FLAG included in the flag information FLAG_INF.

In an embodiment, when the flag (FLAG) included in the flag information FLAG_INF is 0, the memory device 100 may be in a state in which the garbage collection is not necessary. On the contrary, when the flag (FLAG) included in the flag information FLAG_INF is 1, the memory device 100 may be in a state in which the garbage collection is necessary. In some implementations, the flag (FLAG) indicates 0 when the garbage collection is necessary and indicates 1 when the garbage collection is not necessary.

The host 300 may output a garbage collection request GC_REQ for performing the garbage collection, based on the flag information FLAG_INF received from the garbage collection state determiner 210.

The memory controller 200 may include the block information storage unit 220. The block information storage unit 220 may store information on a plurality of memory blocks included in the memory device 100. The information on the plurality of memory blocks may include information on at least the number of total blocks, the number of reserved blocks, the number of free blocks, the number of open blocks, or the number of bad blocks. The number of bad blocks is obtained by adding up the number of run-time bad blocks RTBB and the number of manufacturer bad blocks MBB. The run-time bad blocks RTBB refer to blocks that are determined as unreliable based on a runtime error and the manufacturer bad blocks MBB refer to blocks that are determined as unreliable based on a manufacturing error. The run-time bad blocks RTBB and the manufacturer bad blocks MBB may be not used to store data.

In an embodiment, the number of reserved blocks may mean a number of memory blocks included in the memory device 100 but not used to store data. Some of the reserved blocks may be set as free blocks. The free blocks may be or include memory blocks allocated to perform the garbage collection among the reserved blocks. The free block may be or include a memory block to which a valid page is copied, when the memory controller 200 performs the garbage collection. The information stored in the block information storage unit 220 may include other various information on the plurality of memory blocks than the above-described information.

The block information storage unit 220 may make a request to the memory device 100 for bad block generation information BBG_INF. The bad block generation information BBG_INF may include information on one or more memory blocks which are included in the memory device 100 and treated as a bad block. In response to the request, the block information storage unit 220 may receive, from the memory device, bad block generation information BBG_INF. The block information storage unit 220 may update a number of bad blocks, based on the bad block generation information BBG_INF. The block information storage unit 220 may store the updated number of bad blocks.

The block information storage unit 220 may output block information BLK_INF stored therein. The block information BLK_INF may be or include information on the plurality of memory blocks. The block information BLK_INF may include information for setting a threshold value for performing the garbage collection. The block information storage unit 220 may output the block information BLK_INF to the garbage collection state determiner 210.

The memory controller 200 may include a garbage collection performing unit 230. The garbage collection performing unit 230 may receive a garbage collection request GC_REQ from the host 300. The garbage collection performing unit 230 may perform operations for performing the garbage collection, based on the garbage collection request GC_REQ received from the host 300. The operations for performing the garbage collection may include a program operation and an erase operation. The garbage collection performing unit 230 may provide the memory device 100 with a command, an address, and data to perform the garbage collection.

The memory device 100 may be in communication with the memory controller 200 and store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. In some implementations, the memory block may be a unit for erasing data.

In an embodiment, the memory device 100 may be or include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or others. In this specification, for convenience of description and as an example purpose only, a case where the memory device 100 is a NAND flash memory is assumed and described.

In an embodiment, the memory device 100 may be implemented in a three-dimensional array structure. The disclosed technology may be applied to not only a flash memory device in which a charge storage layer is configured with a Floating Gate (FG) but also a Charge Trap Flash (CTF) in which a charge storage layer is configured with an insulating layer.

In an embodiment, each of the memory cells included in the memory device 100 may be configured as a Single Level Cell (SLC) for storing one data bit. In some implementations, each of the memory cells included in the memory device 100 may be configured as a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. Thus, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory device 100 may perform a program operation or erase operation by using an operating voltage under the control of the memory controller 200. The operating voltage may be preset.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In some implementations, the memory controller 200 may store, in a buffer memory 220, logical-physical address mapping information that establishes a mapping relationship between the LBA and the PBA.

The memory controller 200 may control the memory device 100 to perform a program operation, a read operation, an erase operation, or others in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), or a Load Reduced DIMM (LRDIMM).

Figure 2:
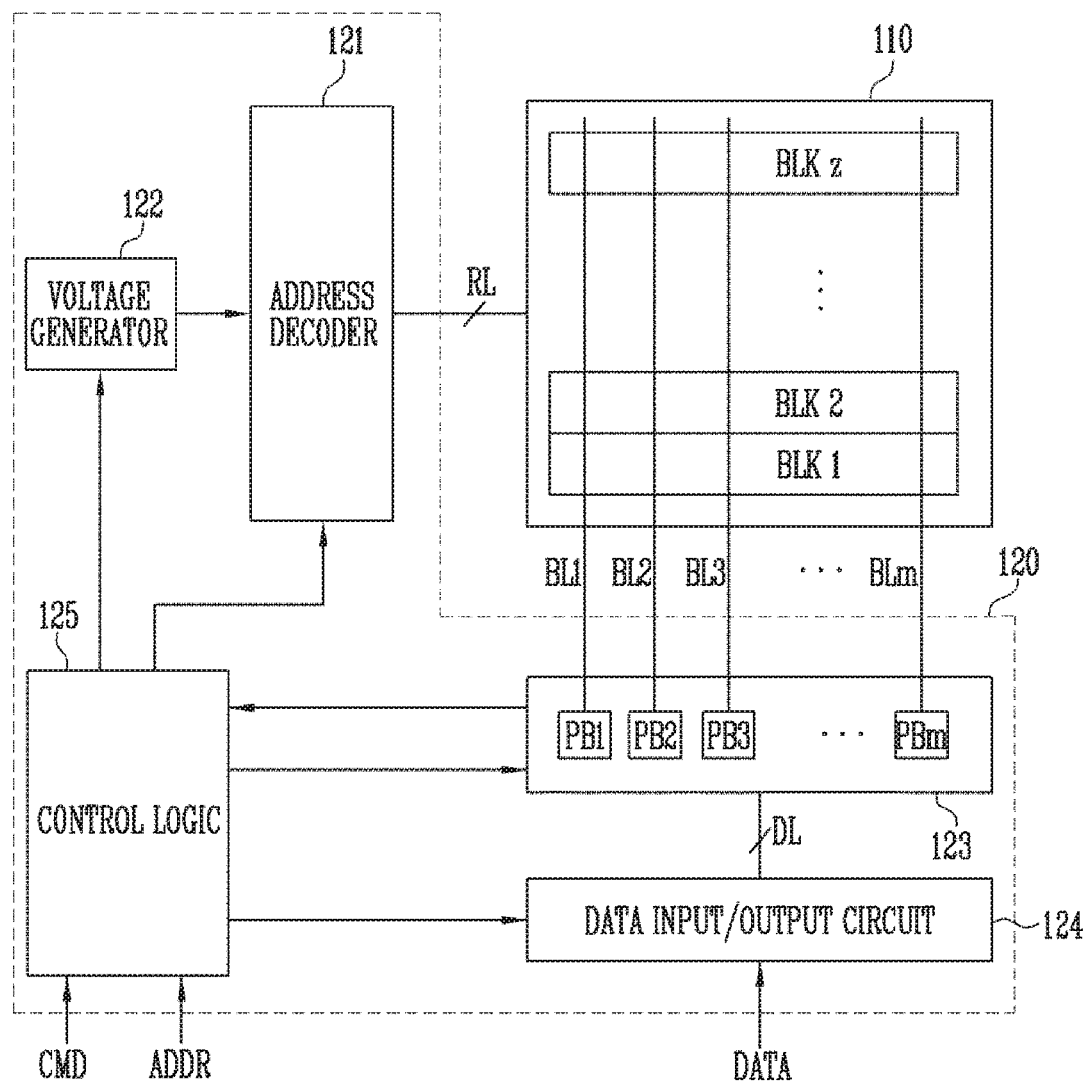
FIG. 2 is an example of a block diagram illustrating a structure of a memory device shown in FIG. 1.

FIG. 2 is a block diagram illustrating a structure of the memory device shown in FIG. 1.

Referring to FIG. 2, the memory device 100 includes a memory cell array 110 and a peripheral circuit 120 including a control logic 125.

The memory cell array 110 may include a plurality of memory blocks BLK1 to BLKz. The plurality of memory blocks BLK1 to BLKz are coupled to an address decoder 121 through row lines RL, and are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells.

A plurality of memory cells included in the memory cell array may be divided into a plurality of blocks based on usage thereof. System information including various setting information which is necessary to control the memory device 100 may be stored in the plurality of blocks.

Each of first to zth memory blocks BLK1 to BLKz includes a plurality of cell strings. First to mth cell strings are coupled to first to mth bit lines BL1 to BLm, respectively. Each of the first to mth cell strings includes a drain select transistor, a plurality of memory cells coupled in series, and a source select transistor. The drain select transistor is coupled to a drain select line. First to nth memory cells are coupled to first to nth word lines. The source select transistor is coupled to a source select line. A drain side of the drain select transistor is coupled to a corresponding bit line. The drain select transistors of the first to mth cell strings are coupled to the first to mth bit lines BL1 to BLm, respectively. A source side of the source select transistor is coupled to a common source line. In an embodiment, the common source line may be commonly coupled to the first to zth memory blocks BLK1 to BLKz. The drain select line DSL, the first to nth word lines, and the source select line are included in the row lines RL. The drain select line DSL, the first to nth word lines, and the source select line are controlled by the address decoder 121. The common source line is controlled by the control logic 125. The first to mth bit lines BL1 to BLm are controlled by the read/write circuit 123.

The peripheral circuit 120 includes the address decoder 121, a voltage generator 122, the read/write circuit 123, a data input/output circuit 124, and the control logic 125.

The address decoder 121 is coupled to the memory cell array 110 through the row lines RL. The address decoder 121 is configured to operate under the control of the control logic 125. The address decoder 121 receives an address ADDR through the control logic 125.

In an embodiment, a program operation and a read operation of the memory device 100 are performed in the unit of a page.

In the program and read operations, the address ADDR received by the control logic 125 may include a block address and a row address. The address decoder 121 is configured to decode the block address in the received address ADDR. The address decoder 121 selects one memory block among the memory blocks BLK1 to BLKz according to the decoded block address.

The address decoder 121 is configured to decode the row address in the received address ADDR. The address decoder 121 selects one word line of a selected memory block by applying voltages provided from the voltage generator 122 to the row lines RL according to the decoded row address.

In an erase operation, the address ADDR includes a block address. The address decoder 121 decodes the block address, and selects one memory block according to the decoded block address. The erase operation may be performed on the whole or a portion of the one memory block.

In a partial erase operation, the address ADDR may include block and row addresses. The address decoder 121 selects one memory block among the memory blocks BLK1 to BLKz according to the block address.

The address decoder 121 is configured to decode the row addresses in the received address ADDR. The address decoder 121 selects at least one word line of the selected memory block by applying voltages provided from the voltage generator 122 to the row lines RL according to the decoded row addresses.

In an embodiment, the address decoder 121 may include a block decoder, a word line decoder, an address buffer, others.

The voltage generator 122 generates a plurality of voltages, using an external power voltage supplied to the memory device 100. The voltage generator 122 operates under the control of the control logic 125.

In an embodiment, the voltage generator 122 may generate an internal power voltage by regulating the external power voltage. The internal power voltage generated by the voltage generator 122 is used as an operating voltage of the memory device 100.

In an embodiment, the voltage generator 122 may generate a plurality of voltages, using the external power voltage or the internal power voltage.

For example, the voltage generator 122 may include a plurality of pumping capacitors for receiving the internal power voltage, and generate a plurality of voltages by selectively activating the plurality of pumping capacitors under the control of the control logic 130. The plurality of generated voltages are applied to word lines selected by the address decoder 121.

In a program operation, the voltage generator 122 may generate a high-voltage program pulse and a pass pulse lower than the program pulse. In a read operation, the voltage generator 122 may generate a read voltage and a pass voltage higher than the read voltage. In an erase operation, the voltage generator 122 may generate an erase voltage.

The read/write circuit 123 includes first to mth page buffers PB1 to PBm. The first to mth page buffers PB1 to PBm are coupled to the memory cell array 110 respectively through the first to mth bit lines BL1 to BLm. The first to mth page buffers PB1 to PBm operate under to control of the control logic 125.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, when a program pulse is applied to a selected word line, the first to mth page buffers PB1 to PBm may transfer the data DATA received through the data input/out circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. A threshold voltage of a memory cell coupled to a bit line to which a program inhibit voltage (e.g., a power voltage) may be maintained. In a program verify operation, the first to mth page buffers PB1 to PBm read page data from selected memory cells through the bit lines BL1 to BLm.

In a read operation, the read/write circuit 123 reads data DATA from memory cells of a selected page through the bit lines BL, and outputs the read data DATA to the data input/output circuit 124. In an erase operation, the read/write circuit 123 may float the bit lines BL.

In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 125. In a program operation, the data input/output circuit 124 receives data DATA to be stored from an external controller (not shown).

The control logic 125 is coupled to the address decoder 121, the voltage generator 122, the read/write circuit 123, and the data input/output circuit 124. The control logic 125 may control overall operations of the memory device 100. The control logic 125 receives a command CMD and an address ADDR. The control logic 125 controls the address decoder 121, the voltage generator 122, the read/write circuit 123, and the data input/output circuit 124 in response to the command CMD.

Figure 3:
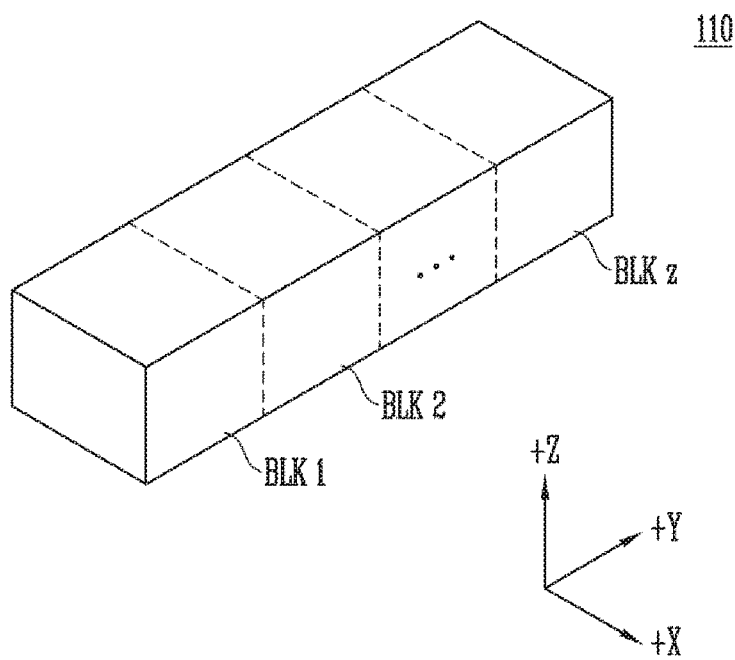
FIG. 3 is an example of a diagram illustrating an embodiment of a memory cell array shown in FIG. 2.

FIG. 3 is an example of a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
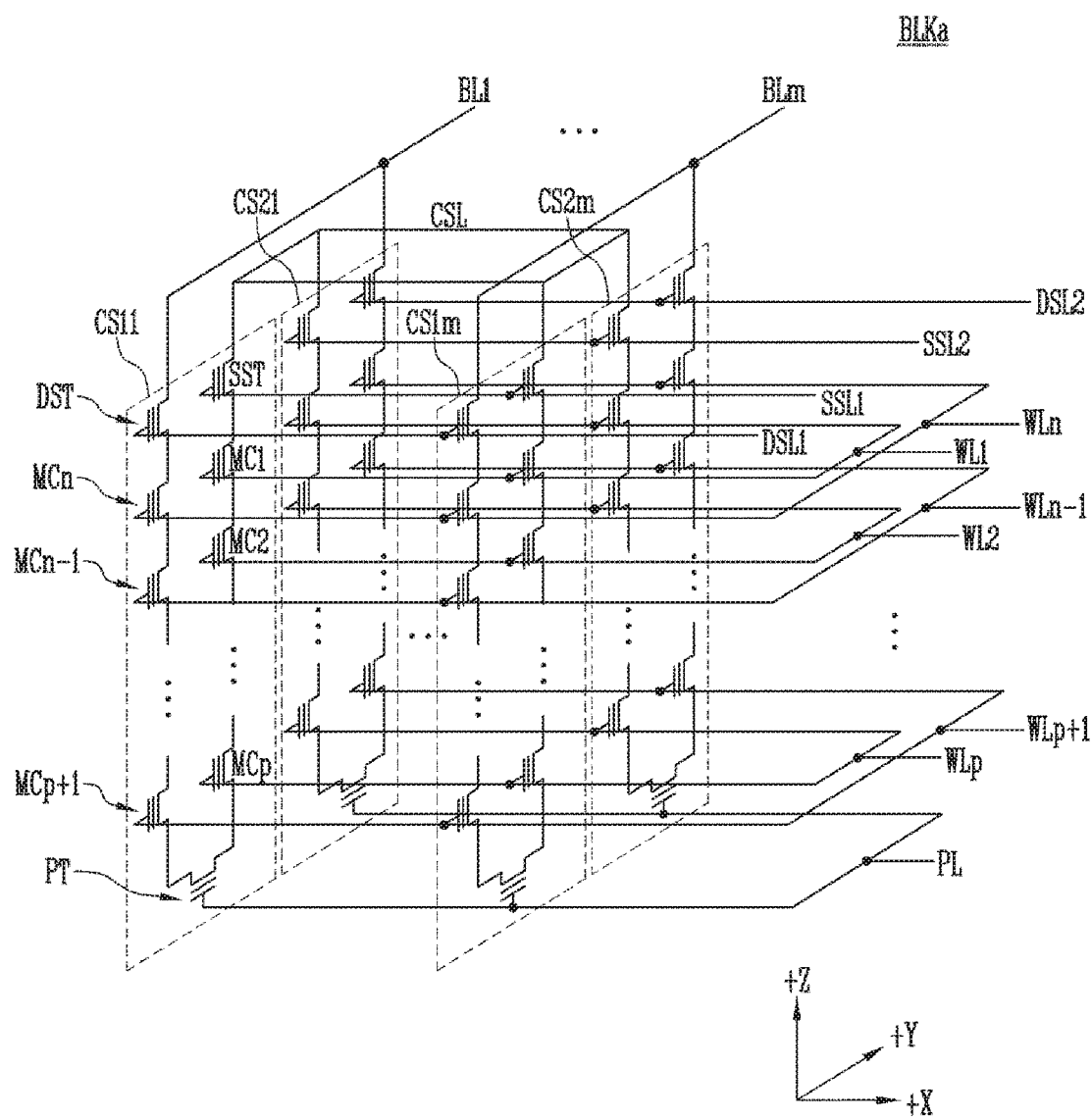
FIG. 4 is an example of a circuit diagram illustrating any one memory block among memory blocks shown in FIG. 3.

FIG. 4 is an example of a circuit diagram illustrating any one memory block BLKa among memory blocks BLK1 to BLKz shown in FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
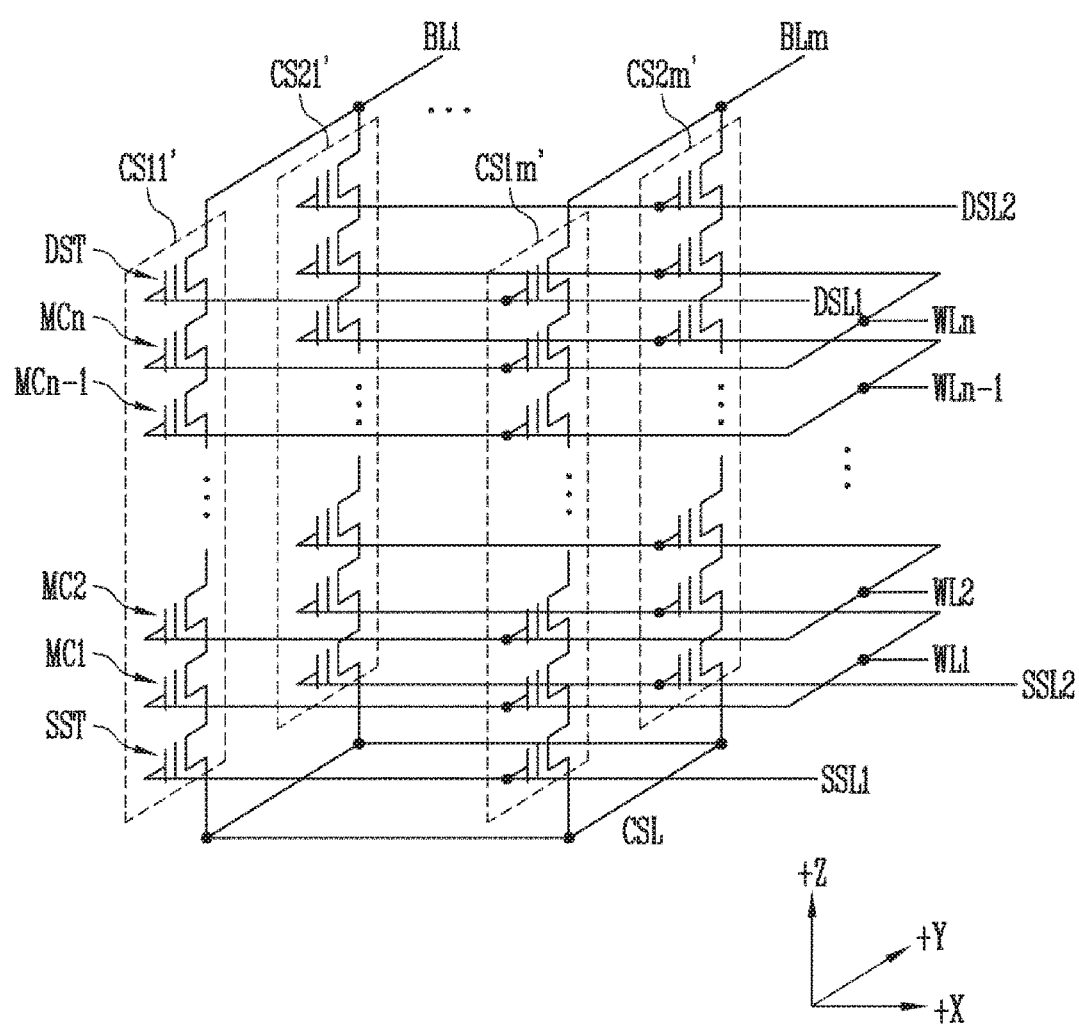
FIG. 5 is an example of a circuit diagram illustrating another embodiment of the one memory block among the memory blocks shown in FIG. 3.

FIG. 5 is an example of a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
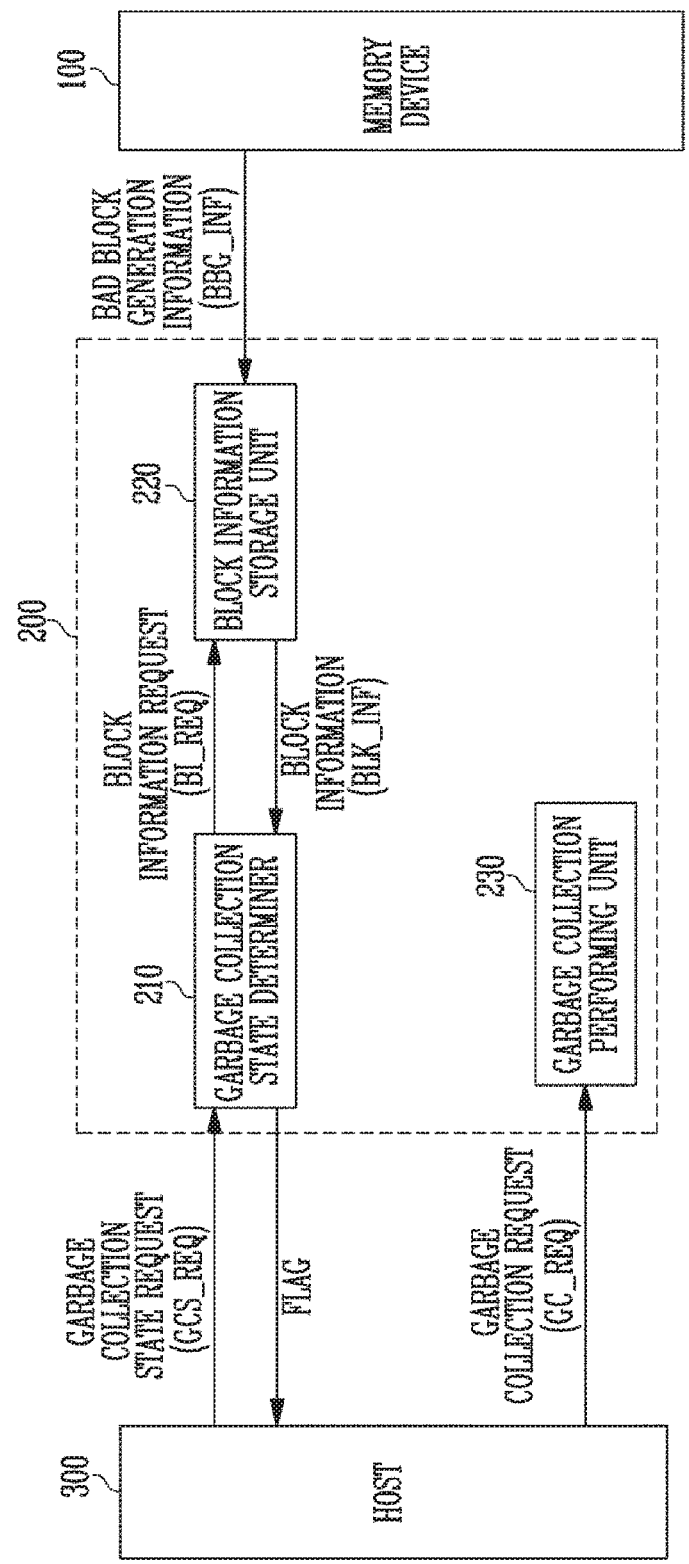
FIG. 6 is an example of a diagram illustrating a configuration of a memory controller shown in FIG. 1.

FIG. 6 is a diagram illustrating a configuration of the memory controller shown in FIG. 1.

Referring to FIG. 6, the memory controller 200 may include a garbage collection state determiner 210, a block information storage unit 220, and a garbage collection performing unit 230.

The garbage collection state determiner 210 may receive a garbage collection state request GCS_REQ from the host 300. The host 300 may output the garbage collection state request GCS_REQ to determine whether garbage collection GC is necessary in the memory device 100. When the garbage collection state determiner 210 receives the garbage collection state request GCS_REQ from the host 300, the garbage collection state determiner 210 may determine whether the memory device 100 is in a state in which the garbage collection is necessary.

Conventionally, the determination whether the garbage collection is necessary is done by the memory controller autonomously, i.e., independently from the host, and then an operation for the garbage collection is performed based on the autonomous determination by the memory controller. In some implementations of the disclosed technology, the memory controller 200 may perform operations for determining whether the garbage collection is necessary in the memory device in response to a request from the host 300. In some implementations, the memory controller 200 may determine whether the garbage collection is necessary in a request from the host 300 while the memory controller 200 can also autonomously determine whether the garbage collection is necessary without the request from the host 300.

When the garbage collection state determiner 210 receives the garbage collection state request GCS_REQ from the host 300, the garbage collection state determiner 210 may output a block information request BI_REQ to the block information storage unit 220. Thus, the block information request BI_REQ may be output to determine whether the garbage collection is necessary in the memory device 100. IN some implementations, in response to the block information request BI_REQ, the garbage collection state determiner 210 may receive information on a plurality of memory blocks included in the memory device 100.

The garbage collection state determiner 210 may make request to the block information storage unit 220 for block information BLK_INF. The garbage collection state determiner 210 may receive block information BLK_INF corresponding to the block information request BI_REQ from the block information storage unit 220. The garbage collection state determiner 210 may determine whether the memory device 100 is in the state in which the garbage collection is necessary, based on the block information BLK_INF.

The information included in the block information BLK_INF has been already discussed with regard to FIG. 1. For example, the garbage collection state determiner 210 may output flag information FLAG_INF representing whether the memory device 100 is in the state in which the garbage collection is necessary, based on the block information BLK_INF. That is, the garbage collection state determiner 210 may output flag information FLAG_INF that responds to the garbage collection state request GCS_REQ. The flag information FLAG_INF may be determined based on a number of bad blocks and a number of free blocks among the plurality of memory blocks.

In an embodiment, when a flag FLAG included in the flag information FLAG_INF is set to 0, the memory device 100 may be in a state in which the garbage collection is not necessary. On the contrary, when the flag FLAG is set to 1, the memory device 100 may be in a state in which the garbage collection is necessary. Other implementations are also possible such that the flag FLAG indicates 0 when the garbage collection is necessary and indicates 1 when the garbage collection is not necessary.

The block information storage unit 220 may make a request to the memory device 100 for bad block generation information BBG_INF. The bad block generation information BBG_INF may include information on a memory block treated as a bad block among the plurality of memory blocks included in the memory device 100. The block information storage unit 220 may receive bad block generation information BBG_INF corresponding to a request from the memory device 100.

The block information storage unit 220 may store block information BLK_INF on the plurality of memory blocks included in the memory device 100. The block information BLK_INF may include information on a number of total blocks, a number of reserved blocks, a number of free blocks, a number of open blocks, and a number of bad blocks. The number of bad blocks is obtained by adding up a number of run-time bad blocks RTBB and a number of manufacturer bad blocks MBB. The bad block may indicate a block that cannot store any data among the plurality of memory blocks.

In an embodiment, the number of reserved blocks may mean a number of memory blocks included in the memory device 100 but not used to store data. The number of free blocks is a number of reserved blocks which are allocated to perform the garbage collection. The free block may be or include a memory block to which a valid page is copied, when the memory controller 200 performs the garbage collection. The number of reserved blocks and the number of free blocks among the plurality of memory blocks may be preset when the memory device is initialized.

In an embodiment, the number of open blocks may mean a number of memory blocks in which data is stored among the plurality of memory blocks. When data is stored in all pages included in an open block, the open block may be referred to as a closed block.

In an embodiment, when the memory device 100 is initialized, the block information storage unit 220 may receive a number of manufacture bad blocks MBB stored in the memory device 100. The manufacturer bad block MBB may be a bad block generated when the memory device 100 is produced.

When the memory device 100 is initialized, the block information storage unit 220 may store the number of manufacturer bad blocks MMB as a number of bad blocks. Subsequently, when a run-time bad block RTBB is generated while an operation of the memory device is being performed, the block information storage unit 220 may store a number obtained by adding a number of the run-time bad block RTBB and the number of manufacturer bad blocks MBB as the number of bad blocks.

In some implementations, the block information storage 220 may receive bad block generation information BBG_INF from the memory device 100. The bad block generation information BBG_INF may include information on a memory block processed as a bad block among the plurality of memory blocks included in the memory device 100. That is, the bad block generation information BBG_INF may include information on a number of run-time bad blocks RTBB generated during an operation of the memory device 100. Therefore, the block information storage unit 220 may determine a number of bad blocks, based on the bad block generation information BBG_INF. Consequently, the block information storage unit 220 may store, as the number of bad blocks, a number of memory blocks, which is obtained by adding up the number of manufacturer bad block MBB and the number of run-time bad blocks RTBB, which is determined based on the bad block generation information BBG_INF.

In some implementations, when the block information storage unit 220 receives the bad block generation information BBG_INF from the memory device 100, the block information storage unit 220 may update a number of bad blocks. For example, when the block information storage unit 220 receives the bad block generation information BBG_INF from the memory device 100, the block information storage unit 220 may update a number of run-time bad blocks RTBB. Therefore, the number of bad blocks may be updated based on the updated number of run-time bad blocks. When the block information storage unit 220 receives the bad block generation information BBG_INF, the block information storage unit 220 may store the updated number of bad blocks.

When the block information storage unit 220 receives a block information request BI_REQ from the garbage collection state determiner 210, the block information storage unit 220 may output block information BLK_INF stored therein. The block information BLK_INF may include information on a number of total blocks, a number of reserved blocks, a number of free blocks, a number of open blocks, and a number of bad blocks.

The garbage collection state determiner 210 may determine whether the memory device 100 is in the state in which the garbage collection is necessary, based on the block information BLK_INF. The garbage collection state determiner 210 may output flag information FLAG_INF to the host 300, based on the determination result obtained by determining whether the memory device 100 is in the state in which the garbage collection is necessary. The flag information FLAG_INF may represent whether the memory device 100 is in the state in which the garbage collection is necessary. A flag FLAG included in the flag information FLAG_INF may be set to 0 or 1. The flag FLAG may be set based on a number of bad blocks and a number of free blocks among a plurality of memory blocks.

In some implementations, the garbage collection state determiner 210 may receive block information BLK_INF, and set a flag FLAG, based on a number of free blocks and a difference between a number of memory blocks and a number of bad blocks, which are included in the block information BLK_INF. In some implementations, when the block information BLK_INF is updated, the garbage collection state determiner 210 may set a flag FLAG, based on a number of bad blocks included in the updated block information BLK_INF. Thus, the garbage collection state determiner 210 may receive block information BLK_INF including the updated number of bad blocks, and set a flag FLAG, based on the number of free blocks and the difference between the number of memory blocks and the updated number of bad blocks.

In an embodiment, when the number of free blocks is greater than or equal to the difference between the number of memory blocks and the updated number of bad blocks, the garbage collection state determiner 210 may determine that the memory device 100 is in the state in which the garbage collection is not necessary. The garbage collection state determiner 210 may output flag information FLAG_INF including a flag FLAG set to represent that the garbage collection is not necessary, in response to a garbage collection state request GCS_REQ received from the host 300. As an example, when the garbage collection is not necessary, the flag FLAG may be set to 0.

In another embodiment, when the number of free blocks is smaller than that between the number of memory blocks and the updated bad blocks, the garbage collection state determiner 210 may determine that the memory device 100 is in the state in which garbage collection is necessary. The garbage collection state determiner 210 may output flag information FLAG_INF including a flag FLAG set to represent that the garbage collection is necessary, in response to the garbage collection state request GCS_REQ receive from the host 300. As an example, when the garbage collection is necessary, the flag FLAG may be set to 1.

The host 300 may receive a flag FLAG included in the flag information FLAG_INF from the garbage collection state determiner 210. The flag FLAG may be set to 0 or 1. When the host 300 receives the flag FLAG set to 0 indicating that the garbage collection is not necessary, the host 300 may not output the garbage collection request GC_REQ to the memory controller 200. On the other hand, when the host 300 receives the flag FLAG set to 1 indicating that the garbage collection is necessary, the host 300 may output the garbage collection request GC_REQ to the memory controller 200.

The garbage collection performing unit 230 may receive a garbage collection request GC_REQ from the host 300. The garbage collection performing unit 230 may perform an operation corresponding to the garbage collection request GC_REQ. The garbage collection performing unit 230 may provide the memory device 100 with a command, an address, and data to perform the garbage collection. When the garbage collection state determiner 210 determines that the memory device 100 is in the state in which the garbage collection is necessary, the garbage collection performing unit 230 may perform operations for performing the garbage collection.

FIGS. 7A and 7B are examples of diagrams illustrating an embodiment in which a garbage collection is performed.

Referring to FIG. 7A is an example of a diagram illustrating a plurality of memory blocks included in the memory device 100 shown in FIG. 1. FIG. 7B is an example of a diagram illustrating block information BLK_INF stored in the block information storage unit 220. The block information BLK_INF may include information on the memory blocks expressed in FIG. 7A.

In FIGS. 7A and 7B, a case where the memory device 100 includes zeroth to forty-seventh memory blocks BLK0 to BLK47 is assumed. Therefore, the number of total blocks may be 48. The numbers used in FIGS. 7A and 7B are only an example and other implementations are also possible. In another embodiment, the memory device 100 may include a larger number of memory blocks.

The zeroth to fifteenth memory blocks BLK0 to BLK15 among the plurality of memory blocks included in the memory device 100 may be reserved blocks. The reserved blocks may be or include memory blocks included in the memory device 100 but not used to store data. The reserved blocks may be preset when the memory device 100 is initialized. Thus, at the time of initialization of the memory device 100, the zeroth to fifteenth memory blocks BLK0 to BLK15 may be set as reserved blocks. Although FIG. 7A shows 16 reserved blocks, other implementations are also possible. Thus, various numbers of reserved blocks may be set in various implementations.

In an embodiment, some of the reserved blocks may be set as free blocks. The free block may be or include a memory block to which data of a valid page included in memory blocks selected as victim blocks is copied, when a garbage collection is performed. Therefore, a sufficient number of free blocks can be ensured such that the memory controller 200 performs the garbage collection. In the example of FIG. 7A, the zeroth to seventh memory blocks BLK0 to BLK7 among the reserved blocks are set as free blocks.

The sixteenth to forty-seventh memory blocks BLK16 to BLK47 among the plurality of memory blocks included in the memory device 100 may be open blocks. The open block may be or include a memory block in which data is stored in some of a plurality of pages included in the memory block. When data is stored in all pages included in an open block, the open block may be referred to as a closed block.

When program fail occurs in the process of storing the data, the open block may be processed as a bad block. When the open block is processed as the bad block, the memory block processed as the bad block may be a run-time bad block.

In FIG. 7A, the sixteenth to forty-seventh memory blocks BLK16 to BLK47 are open blocks, and hence the number of open blocks is 32.

FIG. 7B is an example of a diagram illustrating block information BLK_INF stored in the block information storage unit based on the state shown in FIG. 7A. In an embodiment of FIG. 7A, the number of total blocks included in the memory device 100 is 48. That is, 48 memory blocks from the zeroth memory block to the forty-seventh memory block BLK47 may be included in the memory device 100.

When the memory device 100 is initialized, 16 memory blocks may be set as reserved blocks among the plurality of memory blocks, and 8 memory blocks may be set as free blocks among the plurality of memory blocks. Memory blocks in which data is stored, i.e., sixteenth to forty-seventh memory blocks BLK16 to BLK47 among the plurality of memory blocks, are open blocks, and hence the number of open blocks is 32. Therefore, the block information storage unit 220 may store information on a number of total blocks, a number of reserved blocks, a number of free blocks, a number of open blocks, and a number of bad blocks.

Conventionally, the memory controller autonomously determines whether the memory device 200 is in the state that the garbage collection is necessary, and performs the garbage collection, based on the determination result.

For example, the conventional memory controller performs the garbage collection if the number of free blocks (Free Block#) is smaller than a specific value and if the number of reserved blocks (Reserved Block#) is greater than a specific value. The memory device 100 can secure free bocks through the garbage collection. Since the conventional memory controller performs the garbage collection if the number of reserved blocks is greater than a specific value, when the number of memory blocks allocated as reserved blocks is not greater than the specific value, the garbage collection cannot be performed in the conventional art.

As an example, it is assumed that in the conventional art the garbage collection is performed when the number of free blocks (Free Block#) is smaller than 9 and when the number of reserved blocks (Reserved Block#) is greater than 15. When the memory device is initialized such that the number of reserved blocks is set as 16 and the number of free blocks is 8, the conventional memory controller can perform the garbage collection.

In the convention art, however, when the memory device is initialized, the number of reserved blocks is determined as a fixed value. Hence, once the garbage collection is performed since the condition that the number of free blocks is smaller than the certain value is satisfied, the garbage collection can be infinitely performed. Therefore, the conventional memory controller frequently performs the garbage collection, which causes operations performed by the memory controller to be delayed.

In recognition of the problems above, some implementations of the disclosed technology suggest setting a condition under which the garbage collection is performed differently from the conventional manner. In some implementations, the condition under which the garbage collection is performed may be determined based on whether the number of free blocks is equal to or smaller than a threshold value, when the threshold value may be determined based on the difference between a number of bad blocks and a number of total blocks among the plurality of memory blocks included in the memory device 100. The bad blocks may include run-time blocks RTBB and manufacturer bad blocks MBB. That is, the threshold value may have a value changed depending on time instead of a fixed value. Therefore, the memory controller 200 may set a condition under which the garbage collection is performed, based on information on the plurality of memory blocks included in the memory device 100.

FIGS. 8A and 8B are examples of diagrams illustrating another embodiment in which the garbage collection is performed.

Referring to FIG. 8A is an example of a diagram illustrating a plurality of memory blocks included in the memory device 100 shown in FIG. 1. FIG. 8B is an example of a diagram illustrating block information BLK_INF stored in the block information storage unit 220. The block information BLK_INF may include information on the memory blocks expressed in FIG. 8A. Unlike the block information BLK_INF shown in FIGS. 7A and 7B, the block information BLK_INF shown in FIG. 8B may further include information on a number of run-time bad blocks RTBB and a number of manufacturer bad blocks MBB.

In FIGS. 8A and 8B, a case where the memory device 100 includes zeroth to forty-seventh memory blocks BLK0 to BLK47 is assumed. Therefore, the number of total blocks may be 48. The numbers used in FIGS. 8A and 8B are only an example and other implementations are also possible. In another embodiment, the memory device 100 may include a larger number of memory blocks.

A number of reserved blocks and a number of free blocks among the plurality of memory blocks may be set when the memory device 100 is initialized. In an embodiment, the zeroth to fifteenth memory blocks BLK0 to BLK15 among the plurality of memory blocks included in the memory device 100 may be reserved blocks. The zeroth to seventh memory blocks BLK0 to BLK7 among the reserved blocks may be free blocks.

The sixteenth to forty-seventh memory blocks BLK16 to BLK47 among the plurality of memory blocks included in the memory device 100 may be open blocks. The open block may be a memory block in which data is stored in some of a plurality of pages included in the memory block.

In this implementation, the memory device 100 can further include a bad block. The bad block may include a manufacturer bad block MBB generated when the memory device is produced and a run-time bad block RTBB generated while the memory device 100 is performing the operation. The bad block may mean a memory block in which any data cannot be stored.

A memory block in which invalid data is stored while the memory device 100 is performing the operation may be a run-time bad block RTBB. In an embodiment, the thirty-second to forty-fifth memory blocks BLK32 to BLK45 may be bad blocks generated while the memory device 100 is performing the operation, i.e., run-time bad blocks RTBB. The forty-sixth and forty-seventh memory blocks BLK46 to BLK47 may be manufacturer bad blocks MBB. The manufacturer bad blocks MBB may be bad blocks generated when the memory device 100 is produced.

FIG. 8B is an example of a diagram illustrating block information BLK_INF stored in the block information storage unit 220 based on the state shown in FIG. 8A. In an embodiment of FIG. 8A, the number of total blocks included in the memory device 100 is 48. That is, 48 memory blocks from the zeroth memory block to the forty-seventh memory block BLK47 may be included in the memory device 100. When the memory device 100 is initialized, the number of memory blocks set as reserved blocks among the plurality of memory blocks may be 16, and the number of memory blocks set as free blocks among the plurality of memory blocks may be 8. Memory blocks in which data is stored, i.e., sixteenth to forty-seventh memory blocks BLK16 to BLK47 are open blocks, and hence the number of open blocks is 32. Due to 16 bad blocks including the run-time bad blocks RTBB which have been generated while the memory device 100 is performing the operation and the manufacturer bad blocks MBB which have been generated when the memory device 100 is produced, the number of open blocks becomes 16.

Unlike FIG. 7B, in FIG. 8B, the block information storage unit 220 may store information on a number of bad blocks. The number of bad blocks may be obtained by adding up a number of run-time bad blocks RTBB and a number of manufacturer bad blocks MBB.

Therefore, the block information storage unit 220 may store information on a number of total blocks, a number of reserved blocks, a number of free blocks, a number of open blocks, and a number of bad blocks.

It has been already discussed that the condition under which the garbage collection is performed in the conventional art is based on a number of reserved blocks (Reserved Block#) and a number of free blocks (Free Block#). Unlike the conventional art, in the implementations of the disclosed technology, a condition under which the garbage collection is performed may be determined based on a threshold value instead of the number of reserved blocks (Reserved Block#) and the number of free blocks (Free Block#). The threshold value may be determined based on a number of total blocks (Total Block#) and a number of bad blocks. In an embodiment, the threshold value may be determined based on the difference between the number of total blocks (Total Block#) and the number of bad blocks. The number of bad blocks may be obtained by adding up a number of manufacturer bad blocks MBB and a number of run-time bad blocks RTBB.

Therefore, in the disclosed technology, the memory controller 200 may perform the garbage collection, when the number of free blocks (Free Block#) is smaller than the threshold value. In FIGS. 8A and 8B, the threshold value may be determined as a value 32 which obtained by subtracting the total number of bad blocks including 2 manufacturer bad blocks MBB and 14 run-time bad blocks RTBB from 48 total memory blocks. In FIGS. 8A and 8B, the number of free blocks (Free Block#) is 8. Hence, the condition that the number of free blocks (Free Block#) is smaller than the threshold value is met, and therefore, the memory controller 200 can perform the garbage collection.

In the implementations of the disclosed technology, the threshold value may be updated based on the state of the memory device 100, e.g., whenever the state of the memory device 100 is changed. In an embodiment, the block information storage unit 220 may update block information BLK_INF by receiving bad block generation information BBG_INF from the memory device 100, and output the updated block information BLK_INF to the garbage collection state determiner 210. Upon receiving the updated block information BLK_INF, the garbage collection state determiner 210 may determine whether the memory device 100 is in the state in which the garbage collection is necessary, by calculating a threshold value based on the updated block information BLK_INF.

In an embodiment, the garbage collection state determiner 210 may update the threshold value whenever the garbage collection state determiner 210 receives the bad block generation information BBG_INF from the memory device 100. When the threshold value is updated, the memory controller 200 determines whether the memory device 100 needs the garbage collection based on the updated threshold value and performs the garbage collection based on the determination.

FIG. 9 is an example of a diagram illustrating a bad block table stored in a block information storage unit.

Referring to FIGS. 8A, 8B and 9, FIG. 9 is a diagram illustrating a bad block table after the bad block generation information BBG_INF is received from the memory device 100. In FIG. 9, a case where the thirty-second to forty-fifth memory blocks BLK32 to BLK45 are run-time bad blocks RTBB and the forty-sixth and forty-seventh memory blocks BLK46 and BLK47 are manufacturer bad blocks MBB is assumed.

The bad block table may have a value corresponding to each memory block. The value corresponding to each memory block may be 0 or 1. When the value corresponding to the memory block is 0, the memory block may not be a bad block. When the value corresponding to the memory block is 1, the memory block may be a bad block. In some implementations, the values 0 and 1 can be used such that the value 0 indicates that the memory block may be a bad block and the value 1 indicates that the memory block may be not a bad block. The block information storage unit 220 may receive the bad block generation information BBG_INF from the memory device 100 and update the bad block table corresponding to each memory block.

The block information storage unit 220 may receive information on a manufacturer bad block MBB when the memory device 100 is initialized. The block information storage unit 220 may receive information on a manufacturer bad block MBB, and change a value corresponding to the manufacturer bad block MBB from 0 to 1. In an embodiment, since the case where the forty-sixth and forty-seventh memory blocks BLK46 and BLK47 are manufacturer bad blocks MBB is assumed, the block information storage unit 220 may receive information on the manufacturer bad blocks, and change a value corresponding to each of the forty-sixth and forty-seventh memory blocks BLK46 and BLK47 from 0 to 1.

When an operation of the memory device 100 is performed, some of the plurality of memory blocks included in the memory device 100 may be treated as bad blocks. When a memory block is treated as a bad block while the memory device 100 is performing the operation, the corresponding memory block may correspond to a run-time bad block RTBB. When a run-time bad block RTBB is generated, the memory device 100 may output, to the block information storage unit 220, bad block generation information BBG_INF including information on the run-time bad block RTBB. The block information storage unit 220 may update the bad block table by receiving the bad block generation information BBG_INF.

In an embodiment where the thirty-second to forty-fifth memory blocks BLK32 to BLK45 are run-time bad block RTBB is assumed, the block information storage unit 220 may receive bad block generation information BBG_INF, and change a value corresponding to each of the thirty-second to forty-fifth memory blocks BLK32 to BLK45 from 0 to 1.

The block information storage unit 220 may store a number of bad blocks, which is calculated based on the updated bad block table. In FIG. 9, since the number of manufacturer bad blocks MBB is 2 and the number of run-time bad blocks RTBB is 14, the number of bad blocks is 16. Therefore, the number of bad blocks may be stored as 16 in the block information storage unit 220.

The block information storage unit 220 may output updated block information BLK_INF to the garbage collection state determiner 210. The garbage collection state determiner 210 may update a threshold value that is used to determine whether to perform the garbage collection, based on the updated block information BLK_INF. The garbage collection state determiner 210 may determine whether the garbage collection is to be performed, based on the updated threshold value.

FIGS. 10A and 10B are examples of diagrams illustrating an embodiment in which the garbage collection is not performed.

Referring to FIGS. 10A and 10B, FIG. 10A is an example of a diagram illustrating a plurality of memory blocks included in the memory device 100 shown in FIG. 1. FIG. 10B is an example of a diagram illustrating block information BLK_INF stored in the block information storage unit 220. The block information BLK_INF may include information on the memory blocks shown in FIG. 10A. Unlike the block information BLK_INF shown in FIG. 7B, the block information BLK_INF shown in FIG. 10B may further include a number of run-time bad blocks RTBB and a number of manufacturer bad blocks MBB.

In FIGS. 10A and 10B, a case where the memory device 100 includes zeroth to forty-seventh memory blocks BLK0 to BLK47 is assumed. Therefore, the number of total blocks is 48. In another embodiment, the memory device 100 may include a larger number of memory blocks.

A number of reserved blocks and a number of free blocks among the plurality of memory blocks may be set when the memory device 100 is initialized. In an embodiment, the zeroth to seventh memory blocks BLK0 to BLK7 among the plurality of memory blocks included in the memory device 100 may be reserved blocks. The zeroth to seventh memory blocks BLK0 to BLK7 among the reserved blocks may be free blocks. Therefore, all the reserved memory blocks may be set as free blocks.

In an embodiment, as data is stored in the memory device 100, a run-time bad block RTBB may be generated. In the example, before the run-time bad block RTBB is generated, the eighth to forty-fifth memory blocks BLK8 to BLK45 were open blocks. When an operation of the memory device 100 is performed, such operation causes the generation of the bad blocks and thus the eighth to forty-fifth memory blocks BLK8 to BLK45 become bad blocks. In addition, the forty-sixth and forty-seventh memory blocks BLK46 and BLK47 are manufacturer bad blocks MBB generated when the memory device 100 is produced, and may be treated as bad blocks when the memory device 100 is initialized.

FIG. 10B is a diagram illustrating block information BLK_INF stored in the block information storage unit 220 by reflecting the state shown in FIG. 10A. In an embodiment, the number of total blocks included in the memory device 100 is 48. That is, 48 memory blocks from the zeroth memory block to the forty-seventh memory block BLK47 may be included in the memory device 100. When the memory device 100 is initialized, the number of memory blocks set as reserved blocks among the plurality of memory blocks may be 8, and the number of memory blocks set as free blocks among the plurality of memory blocks may be 8.

Unlike FIGS. 7A and 7B, in FIG. 10B, the block information storage unit 220 may store information on a number of bad blocks. The number of bad blocks may be a number obtained by adding up a number of run-time bad blocks RTBB and a number of manufacturer bad blocks MBB. Therefore, the block information storage unit 220 may store information on a number of total blocks, a number of reserved blocks, a number of free blocks, a number of open blocks, and a number of bad blocks.

Referring to FIGS. 10A and 10B, in the disclosed technology, the garbage collection state determiner 210 may set a threshold value for performing the garbage collection. That is, the threshold value may be determined as a value 8 obtained by subtracting a number 40 obtained by adding up 2 manufacturer bad blocks MBB and 38 run-time bad blocks RTBB from the 48 total memory blocks. Consequently, in FIG. 10B, the number of free blocks (Free Block#) is 8. Hence, the number of free blocks (Free Block#) is equal to 8 that is the threshold value, and therefore, the memory controller 200 can perform the garbage collection.

As the operation of the memory device 100 proceeds, the number of bad blocks among the plurality of memory blocks included in the memory device 100 increases. The memory device 100 may not perform the garbage collection when the condition that the number of free blocks is equal to or smaller than the threshold value is not satisfied. In some implementations, the condition may be not satisfied when there is no free block among memory bocks as the number of bad blocks increases. Thus, the memory controller can stop the garbage collection unlike the conventional memory controller which performs the garbage collection indefinitely. This is because the implementations of the disclosed technology suggest a condition for determining whether to perform the garbage collection based on a threshold value which is determined based on the state of the memory device 100. The suggested memory controller which determines whether to perform the garbage collection using the threshold value allows to prevent the garbage collection from being infinitely performed.

In the implementations of the disclosed technology, the threshold value to determine whether to perform the garbage collection is determined based on the state of the memory device 100. Thus, the threshold value can be set based on the state of the memory device 100, which is changed with time. Accordingly, the garbage collection can be performed based on the state of the memory device 100.

Figure 11:
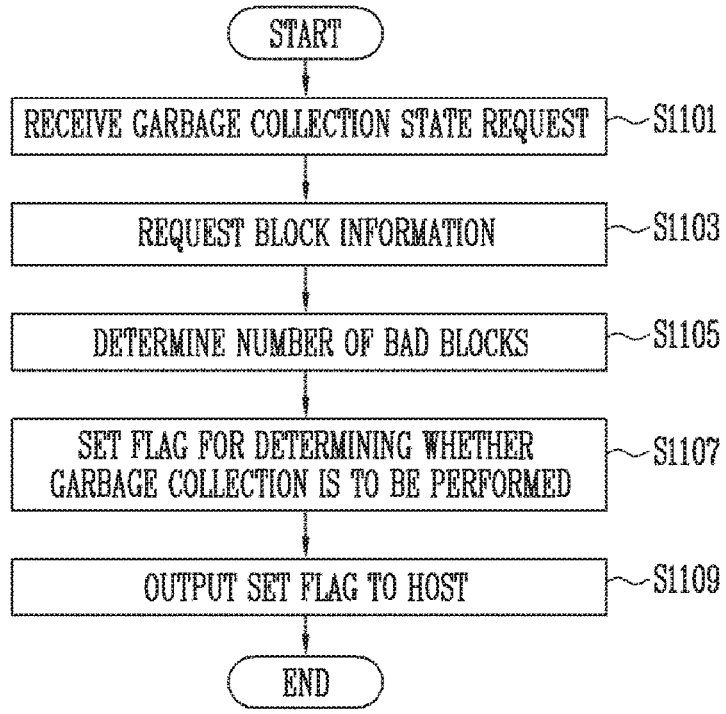
FIG. 11 is an example of a diagram illustrating an operation of the memory controller in accordance with an embodiment of the disclosed technology.

FIG. 11 is a diagram illustrating an operation of the memory controller in accordance with an embodiment of the disclosed technology.

Referring to FIG. 11, in step S1101, the garbage collection state determiner 210 may receive a garbage collection state request GCS_REQ from the host 300. The garbage collection state request GCS_REQ may be a request for determining whether garbage collection GC is necessary in the memory device 100. Conventionally, the memory controller 200 autonomously determined whether the garbage collection was necessary. However, in the disclosed technology, whether the garbage collection is necessary may be determined in response to a request from the host 300.

In step S1103, the garbage collection state determiner 210 may output a block information request BI_REQ. In some implementations, when the garbage collection state determiner 210 receives the garbage collection state request GCS_REQ from the host 300, the garbage collection state determiner 210 may output the block information request BI_REQ to the block information storage unit 220. When the garbage collection state determiner 210 receives the garbage collection state request GCS_REQ from the host 300, the garbage collection state determiner 210 may determine whether the memory device 100 is in a state in which the garbage collection is necessary, based on bock information BLK_INF received from the block information storage unit 220.

In step S1105, the garbage collection state determiner 210 may determine a number of bad blocks. The number of bad blocks is a number obtained by adding up a number of run-time bad blocks RTBB and a number of manufacturer bad blocks MBB. The bad block may be a block that cannot store data among a plurality of memory blocks.

In an embodiment, the garbage collection state determiner 210 may receive block information BLK_INF corresponding to the block information request BI_REQ from the block information storage unit 220. The block information BLK_INF may include information on a number of total blocks, a number of reserved blocks, a number of free blocks, a number of open blocks, and a number of bad blocks. Therefore, the garbage collection state determiner 210 may determine a number of bad blocks by adding up a number of run-time bad blocks RTBB and a number of manufacturer bad blocks MBB, which are included in the block information BLK_INF.

In step S1107, the garbage collection state determiner 210 may set a flag FLAG for determining whether the garbage collection is to be performed. In some implementations, when the garbage collection state determiner 210 determines a number of bad blocks, a threshold value for determining to perform the garbage collection may be determined based on the number of bad blocks. In some implementations, the threshold value may be obtained by subtracting the number of bad blocks from the number of total memory blocks.

In an embodiment, when the number of free block is greater than or equal to the threshold hold, the garbage collection state determiner 210 may determine that the memory device 100 is in a state in which the garbage collection is not necessary, and set the flag FLAG to 0. When the number of free blocks is smaller than the threshold value, the garbage collection state determiner 210 may determine that the memory device 100 is in the state in which the garbage collection is necessary, and set the flag FLAG to 1. In some other implementations, the value of flag can be set as 0 to indicate the state when the garbage collection is necessary, and the value of flag can be set as 0 to indicate the state when the garbage collection is not necessary.

In step S1109, the garbage collection state determiner 210 may output the set flag FLAG to the host 300. The flag FLAG may be set to 0 or 1. The host 300 may output the garbage collection request GC_REQ according to the value of flag FLAG received from the garbage collection state determiner 210. In an embodiment, when the host 300 receives the flag FLAG set to 0, the host 300 may not output the garbage collection request GC_REQ to the memory controller 200. When the host 300 receives the flag FLAG set to 1, the host 300 may output the garbage collection request GC_REQ to the memory controller 200.

Figure 12:
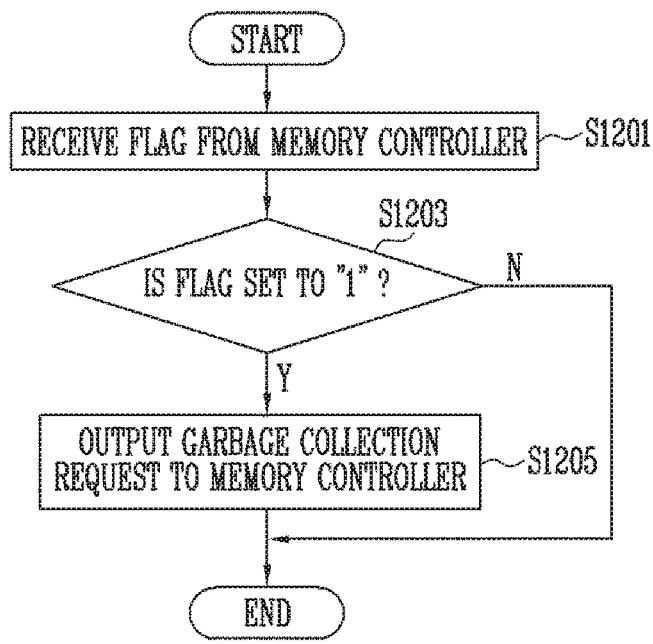
FIG. 12 is an example of a diagram illustrating an operation of a host in accordance with an embodiment of the disclosed technology.

FIG. 12 is an example of a diagram illustrating an operation of the host in accordance with an embodiment of the disclosed technology.

Referring to FIG. 12, in step S1201, the host 300 may receive a flag FLAG from the memory controller 200. The flag FLAG may be included in flag information FLAG_INF. The flag information FLAG_INF may be determined based on a number of bad blocks and a number of free blocks among a plurality of memory blocks.

In some implementations, the host 300 may receive a flag FLAG set to 0 or 1 from the garbage collection state determiner 210. The flag FLAG may represent whether garbage collection is necessary in the memory device 100.

In an embodiment, when the flag FLAG is set to 0, the memory device 100 is in a state in which the garbage collection is not necessary. When the flag FLAG is set to 1, the memory device 100 is in a state in which the garbage collection is necessary. In some implementations, the values 0 and 1 can be used such that the value 0 indicates that the memory block may be a bad block and the value 1 indicates that the memory block may be not a bad block.

In step S1203, the host 300 may check whether the received flag FLAG is set to 1. When the flag FLAG is set to 1, it indicates that the memory device 100 may be in the state in which the garbage collection is necessary. When the flag FLAG is set to 1, the operation proceeds to step S1205.

In the step S1205, the host 300 may output a garbage collection request GC_REQ. When the host 300 receives the flag FLAG set to 1, the host 300 may output the garbage collection request GC_REQ to the garbage collection performing unit 230. The garbage collection performing unit 230 may perform an operation corresponding to the garbage collection request GC_REQ. The garbage collection performing unit 230 may provide the memory device 100 with a command, an address, and data so as to perform the garbage collection.

Figure 13:
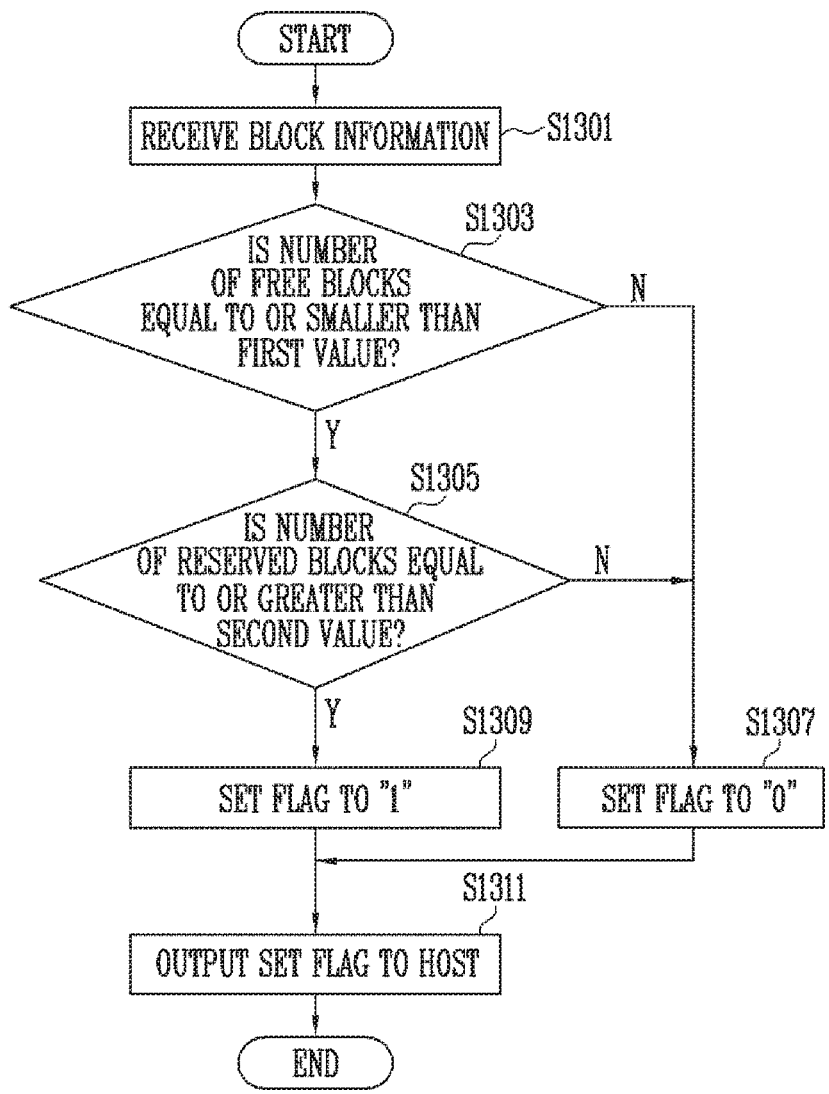
FIG. 13 is an example of a diagram illustrating an operation of the memory controller in accordance with an embodiment of the disclosed technology.

FIG. 13 is a diagram illustrating an operation of the memory controller in accordance with an embodiment of the disclosed technology.

Referring to FIG. 13, FIG. 13 illustrates a conventional method for determining a condition under which garbage collection is performed.

In step S1301, the garbage collection state determiner 210 may receive block information BLK_INF from the block information storage unit 220.

The garbage collection state determiner 210 may output block information request BI_REQ to the block information storage unit 220 to determine whether the garbage collection is necessary in the memory device 100. The garbage collection state determiner 210 may receive block information BLK_INF corresponding to the block information request BI_REQ.

In an embodiment, the block information BLK_INF may include information on a number of total blocks, a number of reserved blocks, a number of free blocks, and a number of open blocks.

In step S1303, the garbage collection state determiner 210 may determine whether the number of free blocks is equal to or smaller than a first value. The first value may be set when the memory device 100 is initialized. When the number of free blocks is smaller than a specific value, it may be determined that the garbage collection is necessary in the memory device 100. When the number of free blocks, which is included in the block information BLK_INF, is equal to or smaller than the first value, the operation proceeds to step S1305. When the number of the free blocks is greater than the first value, the operation proceeds to step S1307.

In the step S1305, the garbage collection state determiner 210 may determine whether the number of reserved blocks is equal to or greater than a second value. The second value may be set when the memory device 100 is initialized. When the number of reserved blocks is greater than a specific value, it is considered that the reserved blocks are sufficient secured in the memory device 100 to perform the garbage collection. Therefore, when the number of reserved blocks is equal to or greater than the second value, the garbage collection may be performed in the memory device 100.

When the number of reserved blocks is equal to or greater than the second value, the operation proceeds to step S1309.

When the number of reserved blocks is smaller than the second value, the operation proceeds to the step S1307.

In the step S1307, the garbage collection state determiner 210 may set a flag FLAG to 0. When the flag FLAG is set to 0, it indicates that the memory device 100 may be in a state in which the garbage collection is not necessary. In an embodiment, the flag FLAG may be set to 0 since it is unnecessary to perform the garbage collection when the number of free blocks among the plurality of memory blocks included in the memory device 100 is secured. In some implementations, the flag FLAG may be set to 0 since the garbage collection cannot be performed when the number of reserved blocks among the plurality of memory blocks included in the memory block 100 is not secured.

In the step S1309, the garbage collection state determiner 210 may set the flag FLAG to 1. When the flag FLAG is set to 1, the memory device 100 may be in the state in which the garbage collection is necessary. In an embodiment, when assuming that the number of reserved blocks among the plurality of memory blocks is set to be equal to or greater than the specific value at the time of the initialization of the memory device 100, if the number of free blocks is equal to or smaller than a specific value, the memory controller 200 may perform operations for performing the garbage collection.

In step S1311, the garbage collection state determiner 210 may output the flag FLAG set to 0 or 1 to the host 300. The host 300 may determine whether a garbage collection request GC_REQ is to be output, based on the value to which the flag FLAG is set. When the memory controller 200 receives the garbage collection request GC_REQ from the host 300, the memory controller 200 may perform an operation for performing the garbage collection.

Figure 14:
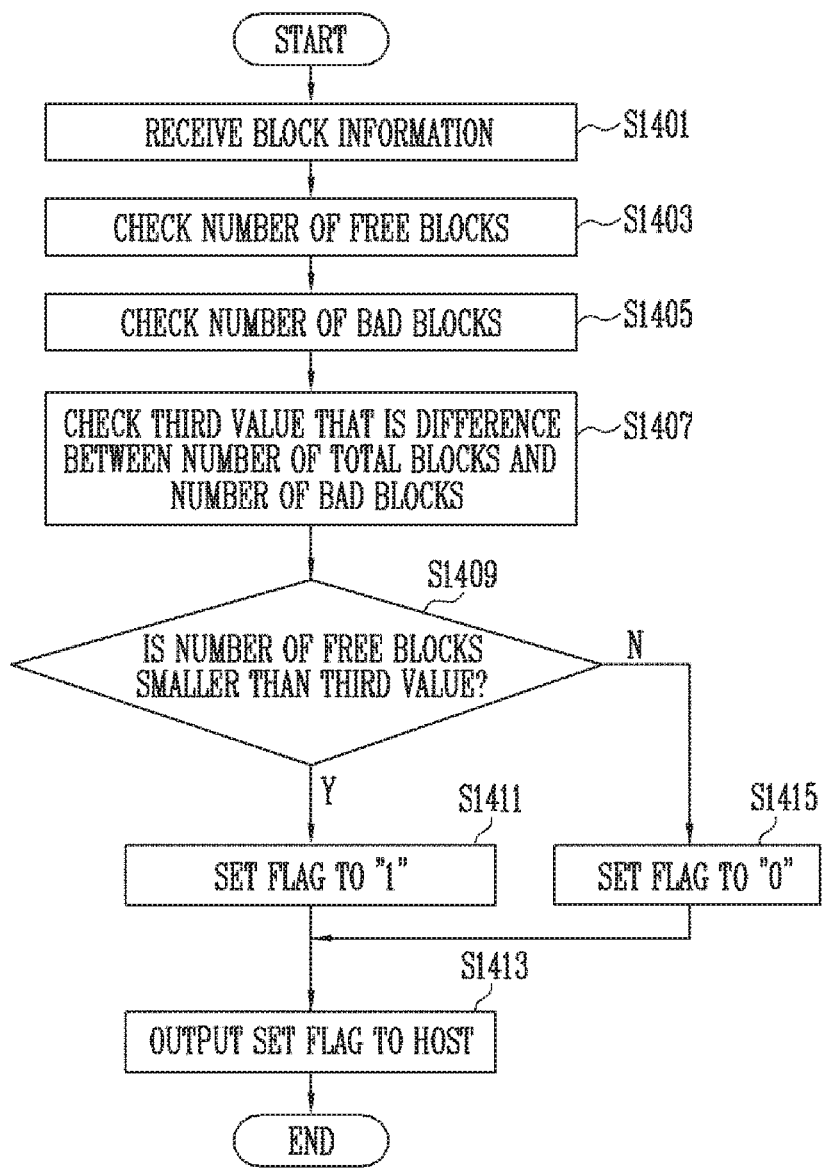
FIG. 14 is an example of a diagram illustrating an operation of the memory controller in accordance with an embodiment of the disclosed technology.

FIG. 14 is a diagram illustrating an operation of the memory controller in accordance with an embodiment of the disclosed technology.

Referring to FIG. 14, FIG. 14 illustrates a method for determining a condition under which garbage collection is performed in the disclosed technology.

In step S1401, the garbage collection state determiner 210 may receive block information BLK_INF from the block information storage unit 220.

Specifically, the garbage collection state determiner 210 may output a block information request BI_REQ to the block information storage unit 220 to determine whether the garbage collection is necessary in the memory device 100. The garbage collection state determiner 210 may receive block information corresponding to the block information request BI_REQ.

In an embodiment, the block information BLK_INF may include information on a number of total blocks, a number of reserved blocks, a number of free blocks, and a number of open blocks. The number of bad blocks is a number obtained by adding up a number of run-time bad blocks RTBB and a number of manufacturer bad blocks MBB. The bad block may be included in the plurality of memory blocks and not used to store any data.

In step S1403, the garbage collection state determiner 210 may determine a number of free blocks, based on the block information BLK_INF. The free blocks may be memory blocks allocated to perform the garbage collection among the reserved blocks. The free block may be or include a memory block to which a valid page is copied, when the memory controller 200 performs the garbage collection. A condition under which the garbage collection is performed may be determined based on the number of free blocks.

In step S1405, the garbage collection state determiner 210 may check a number of bad blocks, based on the block information BLK_INF. The number of bad blocks is a number obtained by adding up a number of run-time bad blocks RTBB and a number of manufacturer bad blocks MBB. When the block information storage unit receives bad block generation information BBG_INF from the memory device 100, the number of bad blocks may be updated based on the bad block generation information BBG_INF. The garbage collection state determiner 210 may check a number of bad blocks, based on the updated number of bad blocks.

In step S1407, the garbage collection state determiner 210 may check a third value that is a difference between a number of total blocks and a number of bad blocks. The third value may be referred to as a threshold value. The threshold value may be determined by subtracting the total number of bad blocks, which is the sum of the number of manufacturer bad blocks MBB and the number of run-time bad blocks RTBB, from the number of total blocks. When the threshold value is determined, the garbage collection state determiner 210 may determine whether the garbage collection is necessary in the memory device 100 using the threshold value.

In step S1409, it may be determined whether the number of free blocks is smaller than the threshold value. In the implementations of the disclosed technology, the garbage collection state determiner 210 may determine a condition under which the garbage collection is performed. Therefore, the garbage collection state determiner 210 may determine whether the garbage collection is to be performed by comparing the number of free blocks with the threshold value. When the number of free blocks is smaller than the threshold value, the operation proceeds to step S1411. When the number of free blocks is equal to or greater than the threshold value, the operation proceeds to step S1415.

In the step S1411, when the number of free blocks is smaller than the threshold value, the garbage collection state determiner 210 may determine that the memory device 100 is in the state in which the garbage collection is necessary. The garbage collection state determiner 210 may set a flag FLAG to 1 to represent that the garbage collection is necessary.

In step S1413, the garbage collection state determiner 210 may output the flag FLAG set to 0 or 1 to the host 300. The host 300 may determine whether a garbage collection request GC_REQ is to output, based on the value to which the flag FLAG is set. When the memory controller 200 receives the garbage collection request GC_REQ from the host 300, the memory controller 200 may perform an operation for performing the garbage collection.

In the step S1415, when the number of free blocks is equal to or greater than the threshold value, the garbage collection state determiner 210 may determine that the memory device 100 is in a state in which the garbage collection is not necessary. The garbage collection state determiner 210 may set the flag FLAG to 0 to represent that the garbage collection is not necessary.

Figure 15:
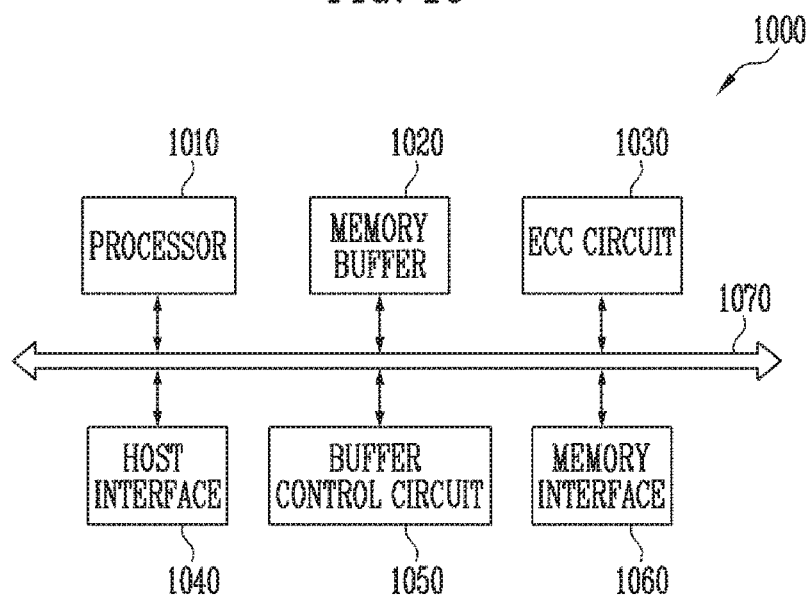
FIG. 15 is an example of a diagram illustrating another embodiment of the memory controller shown in FIG. 1.

FIG. 15 is a diagram illustrating another embodiment of the memory controller shown in FIG. 1.

Referring to FIG. 15, a memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LPA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
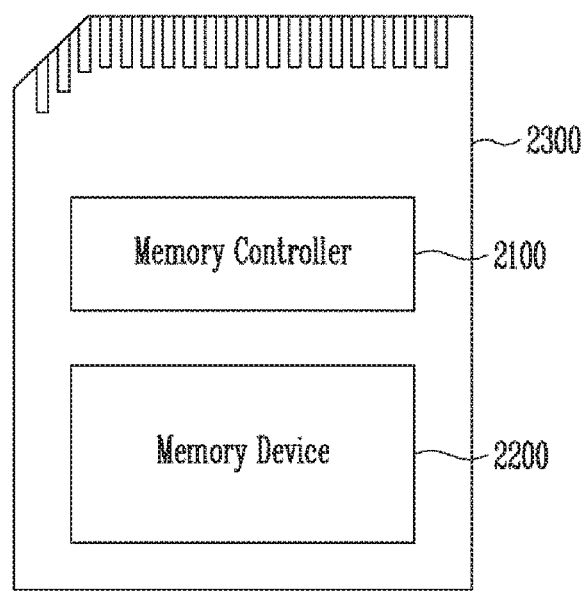
FIG. 16 is an example of a block diagram illustrating a memory card system to which the storage device is applied in accordance with an embodiment of the disclosed technology.

FIG. 16 is a block diagram illustrating a memory card system to which the storage device is applied in accordance with an embodiment of the disclosed technology.

Referring to FIG. 16, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented identically to the memory device 100 described with reference to FIG. 2.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 17:
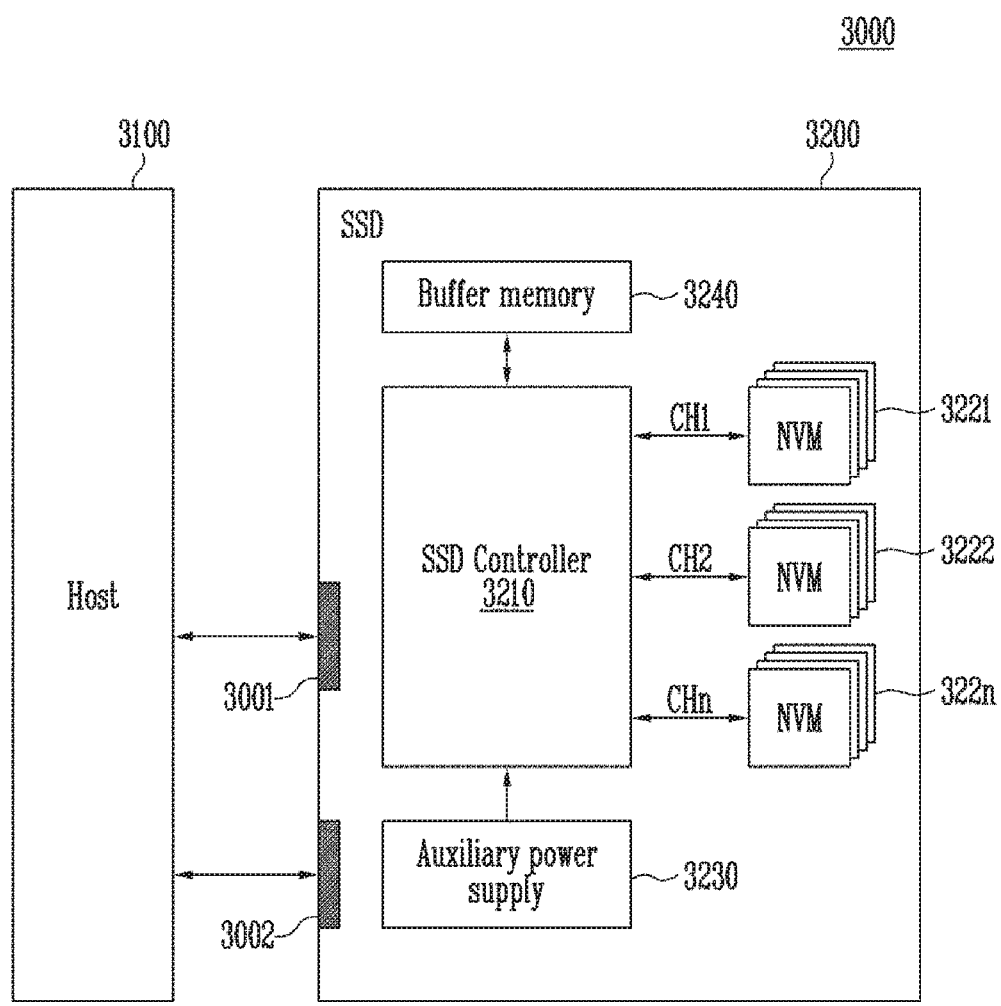
FIG. 17 is an example of a block diagram exemplarily illustrating a Solid State Drive (SSD) system to which the storage device is applied in accordance with an embodiment of the disclosed technology.

FIG. 17 is a block diagram exemplarily illustrating a Solid State Drive (SSD) system to which the storage device is applied in accordance with an embodiment of the disclosed technology.

Referring to FIG. 17, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 18:
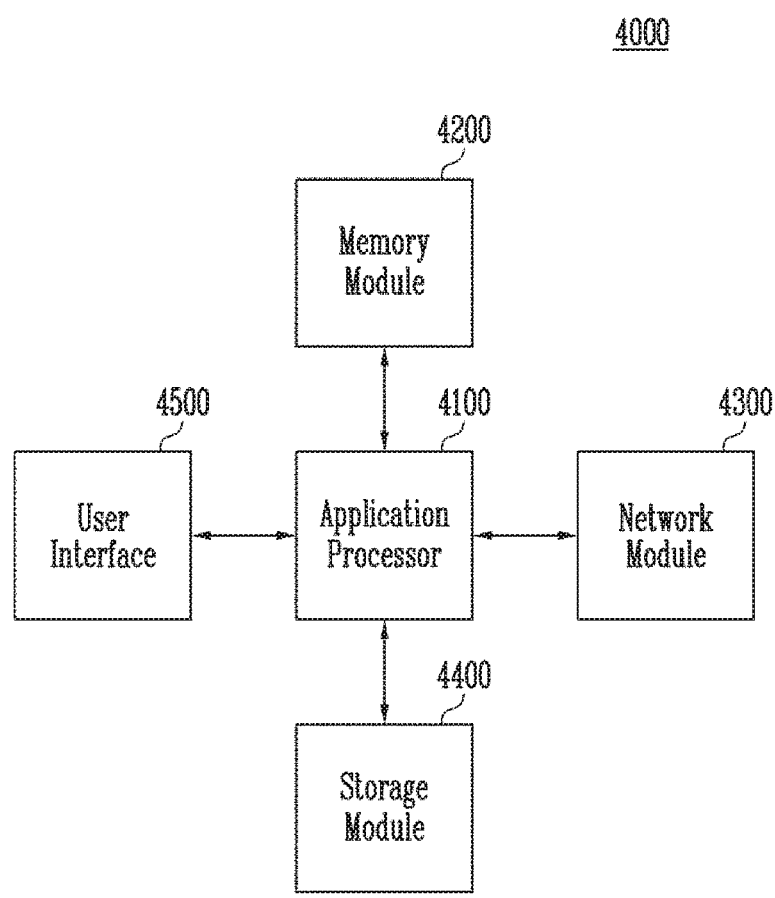
FIG. 18 is an example of a block diagram illustrating a user system to which the storage device is applied in accordance with an embodiment of the disclosed technology.

FIG. 18 is a block diagram illustrating a user system to which the storage device is applied in accordance with an embodiment of the disclosed technology.

Referring to FIG. 18, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIGS. 2 to 5. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the disclosed technology, there can be provided a memory controller configured to set a condition under which garbage collection is performed according to a number of bad blocks, and an operating method of the memory controller.

While the disclosed technology has been shown and described with reference to certain exemplary embodiments thereof, it will be understood by those skilled in the art that various changes in form and details may be made therein without departing from the spirit and scope of the disclosed technology as defined by the appended claims and their equivalents.

Therefore, the scope of the disclosed technology should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. That is, it should be apparent to those skilled in the art that various modifications can be made on the basis of the technological scope of the disclosed technology.

Meanwhile, the exemplary embodiments of the disclosed technology have been described in the drawings and specification. Although specific terminologies are used here, those are only to explain the embodiments of the disclosed technology. Therefore, the disclosed technology is not restricted to the above-described embodiments and many variations are possible within the spirit and scope of the disclosed technology. It should be apparent to those skilled in the art that various modifications can be made on the basis of the technological scope of the disclosed technology in addition to the embodiments disclosed herein.

What is claimed is:

1. A memory controller for controlling a memory device including memory blocks, the memory controller comprising:
    a processor configured to receive a garbage collection state request from a host device and output flag information indicating whether the memory device is in a state that garbage collection is necessary; and
    a block information storage configured to receive and store, from the memory device, bad block generation information including a number of bad blocks included in the memory device that are unable to store data, and store block information including a total number of the memory blocks, the number of bad blocks, and a number of free blocks that store valid data during the garbage collection,
    wherein the processor is configured to generate the flag information indicating whether the memory device is in the state that the garbage collection is necessary based on the number of bad blocks and the number of free blocks.

2. The memory controller of claim 1, wherein the bad blocks include a run-time bad block treated as unreliable due to an operation error caused during an operation of the memory device.

3. The memory controller of claim 1, wherein the bad blocks include a manufacturer bad block treated as unreliable due to a manufacturing error.

4. The memory controller of claim 1, wherein the block information storage is configured to receive, from the memory device, additional bad block generation information upon generation of an additional bad block and to update the number of bad blocks based on the received additional bad block generation information.

5. The memory controller of claim 4, wherein the processor is configured to receive updated number of bad blocks from the block information storage and to provide state information based on the updated number of bad blocks.

6. The memory controller of claim 1, wherein the processor is configured to, in case that the number of free blocks is equal to or greater than the difference between the total number of the memory blocks and the number of bad blocks, output the flag information indicating that the garbage collection is not necessary.

7. The memory controller of claim 1, wherein the processor is configured to generate the flag information indicating that the garbage collection is necessary in case that the number of free blocks is smaller than the difference between the total number of the memory blocks and the number of bad blocks, and generate the flag information indicating that the garbage collection is not necessary in case that the number of free blocks is equal to or greater than the difference between the total number of the memory blocks and the number of bad blocks.

8. The memory controller of claim 1, further comprising a garbage collector configured to provide the memory device with a command, an address and data for performing the garbage collection upon receiving a garbage collection request from the host device.

9. The memory controller of claim 8, wherein, upon receiving the garbage collection state request, the processor is configured to produce a block information request to the block information storage for the block information.

10. The memory controller of claim 9, wherein, upon receiving the block information request, the block information storage is configured to provide the block information to the processor.

11. The memory controller of claim 1, wherein the processor is configured to provide the host device with the flag information indicating whether the memory device is in a state that garbage collection is necessary.

12. A method for operating a memory controller in communication with a memory device including memory blocks, the method comprising:
    sending a request to the memory device for bad block generation information that includes a number of bad blocks, the bad blocks representing those memory blocks in the memory device that are unable to store data;
    receiving the bad block generation information from the memory device;
    storing, based on the bad block generation information, block information including a total number of the memory blocks, the number of bad blocks, a number of free blocks, the free blocks configured to store valid data during garbage collection; and
    determining, based on the block information, whether the memory device is in a state in which the garbage collection is necessary,
    wherein the determining further includes determining whether the number of free blocks is equal to or greater than a difference between the total number of the memory blocks and the number of bad blocks.

13. The method of claim 12, wherein the bad block generation information includes information on a run-time bad block that is treated as unreliable due to an operation error caused during an operation of the memory device, and the number of bad blocks is counted to include a number of run-time bad blocks.

14. The method of claim 12, wherein the bad block generation information includes information on a manufacturer bad block treated as unreliable due to a manufacturing error caused during manufacturing of the memory device, and the number of bad blocks is counted to include a number of manufacturer bad blocks.

15. The method of claim 12, further comprising updating the number of bad blocks upon receiving additional bad block generation information from the memory device upon a generation of an additional bad block.

16. The method of claim 12, further comprising outputting, to a host device in communication with the memory controller, state information representing whether the garbage collection is necessary, based on the determining.

17. The method of claim 15, wherein the determining includes determining that the memory device is in the state in which the garbage collection is necessary upon a determination that the number of free blocks is smaller than the difference between the total number of the memory blocks and updated number of bad blocks.

18. The method of claim 12, wherein the determining includes determining that the memory device is in the state in which the garbage collection is not necessary upon a determination the number of free blocks is equal to or greater than the difference between the number of the memory blocks and the updated number of bad blocks.

19. The method of claim 12, further comprising:
receiving a garbage collection request for performing the garbage collection from a host device; and
performing the garbage collection in response to receiving the garbage collection request.

20. The method of claim 12, further comprising, prior to the sending, receiving a garbage collection state request from a host device in communication with the memory controller, wherein sending of the request is made in response to receiving of the garbage collection state request.

* * * * *